United States Patent [19]

Sato et al.

[11] Patent Number: 5,866,198
[45] Date of Patent: Feb. 2, 1999

[54] METHOD OF FABRICATING A COMPOUND SEMICONDUCTOR HAVING A PLURALITY OF LAYERS USING A FLOW COMPENSATION TECHNIQUE

[75] Inventors: Mitsuo Sato, Zama; Kiyoshi Yoshikawa, Kawasaki; Tomio Minohoshi, Yokohama, all of Japan

[73] Assignee: Kabushiki Kaisha Toshiba, Kawasaki, Japan

[21] Appl. No.: 858,574

[22] Filed: May 19, 1997

Related U.S. Application Data

[63] Continuation of Ser. No. 434,883, May 4, 1995, abandoned, which is a continuation of Ser. No. 76,634, Jun. 15, 1993, abandoned.

[30] Foreign Application Priority Data

Jun. 17, 1992 [JP] Japan .................................... 4-158043

[51] Int. Cl.$^6$ ...................................................... B05D 5/12
[52] U.S. Cl. .................. 427/124; 427/255.2; 427/255.7; 427/419.141; 427/419.8; 438/483
[58] Field of Search .............................. 427/248.1, 255.2, 427/255.7, 419.1, 419.8, 124; 118/715; 438/483; 437/107, 108, 132, 133

[56] References Cited

U.S. PATENT DOCUMENTS

| | | | |
|---|---|---|---|
| 4,761,269 | 8/1988 | Conger et al. | 118/715 |
| 4,801,474 | 1/1989 | Saitoh et al. | 427/248.1 |
| 4,877,650 | 10/1989 | Matsuyama et al. | 427/248.1 |
| 4,911,101 | 3/1990 | Ballingall, III et al. | 118/715 |
| 4,987,096 | 1/1991 | Ishikawa et al. | 437/129 |
| 5,164,363 | 11/1992 | Eguchi et al. | 427/255.1 |
| 5,168,077 | 12/1992 | Ashizawa et al. | 437/107 |
| 5,190,913 | 3/1993 | Higashiyama et al. | 118/725 |
| 5,200,388 | 4/1993 | Abe et al. | 505/1 |
| 5,225,561 | 7/1993 | Kirlin et al. | 546/256 |

FOREIGN PATENT DOCUMENTS

| | | |
|---|---|---|
| 103329 | 6/1984 | Japan . |
| 136038 | 7/1985 | Japan . |
| 184019 | 7/1990 | Japan . |
| 2-184019 | 10/1990 | Japan . |

OTHER PUBLICATIONS

Patent Abstracts of Japan, Section E, Section No. 986, vol. 14, No. 457, p. 57 (Oct. 2, 1990).

*Primary Examiner*—Brian K. Talbot
*Attorney, Agent, or Firm*—Foley & Lardner

[57] ABSTRACT

A vapor deposition device for fabricating a compound semiconductor has many organometallic gas supply systems, each of which for synthesizing and supplying more than one organometallic gas, a first group of valves connected to the organometallic gas supply systems, and the first group of valves for selecting a specific system from among the organometallic gas supply systems by opening and closing the relevant valve group, an organometallic gas supply line connected to the first valve group, a second group of valves connected to the first group of valves for selecting the next organometallic gas supply system to be used among the organometallic gas supply systems by opening and closing the relevant valve group, a vent line connected to the second valve group, a reaction furnace connected to the organometallic gas supply means for continuously propagating different types of thin-films by means of organometallic gases supplied from the organometallic gas supply line, a microcomputer system for controlling the operation of the first group of valves and the second group of valves.

8 Claims, 3 Drawing Sheets

METHOD OF FABRICATING A COMPOUND SEMICONDUCTOR HAVING A PLURALITY OF LAYERS USING A FLOW COMPENSATION TECHNIQUE

This application is a continuation, of application Ser. No. 08/434,883, filed May 4, 1995 now abandoned which application is a continuation, of application Ser. No. 08/076,634, filed Jun. 15, 1993 now abandoned.

BACKGROUND OF THE INVENTION

1. Field of the Invention

The present invention relates to a vapor deposition device for fabricating a compound semiconductor, and, in particular, to a vapor deposition device for fabricating a compound semiconductor wherein an organometallic gas for use in the formation of the next thin film can be immediately provided and supplied to a reaction furnace when different types of thin films are continuously propagated by metal organic chemical vapor deposition (MOCVD) using organic metals, and a constant flow can be normally maintained in the reaction furnace during film-forming so that a thin-film with good uniformity can be obtained.

2. Description of the Prior Art

FIG.1 is a general configuration drawing showing a conventional vapor deposition device for fabricating a compound semiconductor.

In the drawing, the conventional vapor deposition device for fabricating a compound semiconductor comprises a reaction furnace 131; a plurality of bubbler vessels 101 to 105 for storing organic metals used to form various types of films; a plurality of mass flow controllers 111 to 115 for controlling the flow of a carrier gas (for example hydrogen $H_2$) at a specified rate to the primary side of the bubbler vessels 101 to 105; a mass flow controller 116 (for supplying the carrier gas $H_2$) for controlling the flow of the carrier gas $H_2$ for flow compensation; and a plurality of valves 121 to 125 as part of an organometallic gas supply line for forming various films, connected to the secondary side of the bubbler vessels and to the mass flow controller 116.

The operations of the plurality of valves 121 to 125, the mass flow controller 116, and the mass flow controllers 111 to 115 are controlled by a process control unit 150 such as a microcomputer system.

During the formation of a thin-film of a semiconductor, a specified organometallic gas is supplied to the valves 121 to 125 from the secondary side of the bubbler vessels 101 to 105. A plurality of types of synthesized organometallic gases is supplied to the reaction furnace 131 by opening and closing the valves 121 to 125, and the thin film of the semiconductor is formed. For example, when an InGaP thin-film is formed, organic metals TMI (TriMethyl Indium) and TMG (TriMethyl Gallium) are supplied to the reaction furnace 131 through a $PH_3$ (phosphine) and $AsH_3$ (arsine) line 141 and the film is formed by the metal organic chemical vapor deposition (MOCVD) method.

A multilayer thin-film semiconductor device such as an LED and the like is formed by the MOCVD method with a semiconductor laser for a compound semiconductor (in this case a substrate is a GaAs substrate).

When a multilayer thin-film of a semiconductor is formed by means of a conventional vapor deposition device for fabricating a compound semiconductor, after a certain layer is formed the next film-forming organometallic gas is fed to the reaction furnace 131 by opening and closing the valves 121 to 125 under the control of the process control unit 150.

When the valves are opened the flow to the reaction furnace 131 suddenly becomes excessive and a time delay occurs before the flow rate is stabilized to the specified amount, therefore the uniformity of thickness of the resulting film of a semiconductor is poor.

Also, the total flow within the reaction furnace 131 must normally be uniform during the formation of the thin-film in order for the inner pressure of the reaction furnace 131 to be normally uniform.

Specifically, when the inner pressure of the reaction furnace 131 is not uniform, the formed thin-film lacks uniformity because of variations in the inner pressure.

Therefore, when a certain layer of film is formed the organometallic gas is supplied at a specified flow rate and, in the case where the specified total flow is not provided within the reaction furnace 131, a necessary amount of carrier gas is supplied by the mass flow controller 116 to compensate for the flow rate.

However, when the specified flow rate of the organometallic gas differs from a flow rate at the total film-forming time, the flow rate of the carrier gas $H_2$ for flow compensation must also be changed.

When the flow rate in the mass flow controller 126 is changed there is a time delay until the value of the change is stable, therefore there is also a time delay until the inner pressure of the reaction furnace 131 is stabilized, therefore the uniformity of the formed film is poor.

In addition, because of the time delay before the amount of the above-mentioned organometallic gas supplied and the flow rate of the carrier gas for flow compensation reach uniform values, the formed films in a semiconductor is poor and the characteristics of the formed semiconductor are poor.

As outlined above, with a conventional vapor deposition device for fabricating a compound semiconductor:

(1) When the valves 121 to 125 are opened, the flow to the reaction furnace 131 suddenly becomes excessive and a time delay occurs before the flow rate is stabilized to the specified amount, therefore the uniformity of the thickness of the resulting film is poor.

(2) When there is a flow rate change in the mass flow controller which provides flow rate compensation, there is a time delay until the value of the change is stable, therefore a time delay is produced until the inner pressure of the reaction furnace becomes stable and the uniformity of the formed film is poor.

(3) Because there is a time delay before the amount of the above-mentioned organometallic gas supplied and the flow rate of the carrier gas for flow compensation reach a uniform flow value, the formed films is poor and the characteristics of the formed semiconductor are poor.

SUMMARY OF THE INVENTION

Accordingly, an object of the present invention is, with due consideration to the drawbacks of such conventional devices, to provide a vapor deposition device for fabricating a compound semiconductor wherein an organometallic gas used in the formation of the next thin-film can be immediately supplied to a reaction furnace, and a constant flow can be normally maintained in the reaction furnace during film-forming so that a thin-film with good uniformity can be obtained.

As one of preferred embodiments according to the present invention, a vapor deposition device for fabricating a compound semiconductor, comprises:

a plurality of organometallic gas supply systems, each of which for synthesizing and supplying more than one organometallic gas;

a first group of valves connected to the plurality of organometallic gas supply systems, and the first group of valves for selecting a specific system from among the organometallic gas supply systems by opening and closing the relevant valve group;

an organometallic gas supply line connected to the first valve group;

a second group of valves connected to the first group of valves for selecting the next organometallic gas supply system to be used among the organometallic gas supply systems by opening and closing the relevant valve group;

a vent line connected to the second valve group;

a reaction furnace connected to the organometallic gas supply means for continuously propagating different types of thin-films by means of organometallic gases supplied from the organometallic gas supply line;

control means for controlling the operation of the first group of valves and the second group of valves.

In the vapor deposition device for fabricating a compound semiconductor described above, wherein in the organometallic gas supply line the next organometallic gas to be used in a following process is supplied through the second group of valves under the control of the control means, and then in the following process, the next organometallic gas is provided to the reaction furnace through the first group of valves and the second group of valves under the control of the control means.

In the vapor deposition device for fabricating a compound semiconductor described above, wherein each of the organometallic gas supply systems further comprises:

a flow compensation line for supplying a necessary volume of carrier gas and a constant volume of carrier gas for synthesizing a plurality of types of organometallic gases;

a third valve connected to the flow compensation line and the organometallic gas supply line; and a fourth valve connected to the vent line and the third valve, wherein the flow compensation line is connected to the organometallic gas supply line and to the vent line through a third valve and a fourth valve respectively.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof.

First, we will show the outline or features of a vapor deposition device for fabricating a compound semiconductor of the present invention, and then describe the vapor deposition device for fabricating a compound semiconductor as a preferred embodiment of the present invention in detail.

Figure 1:
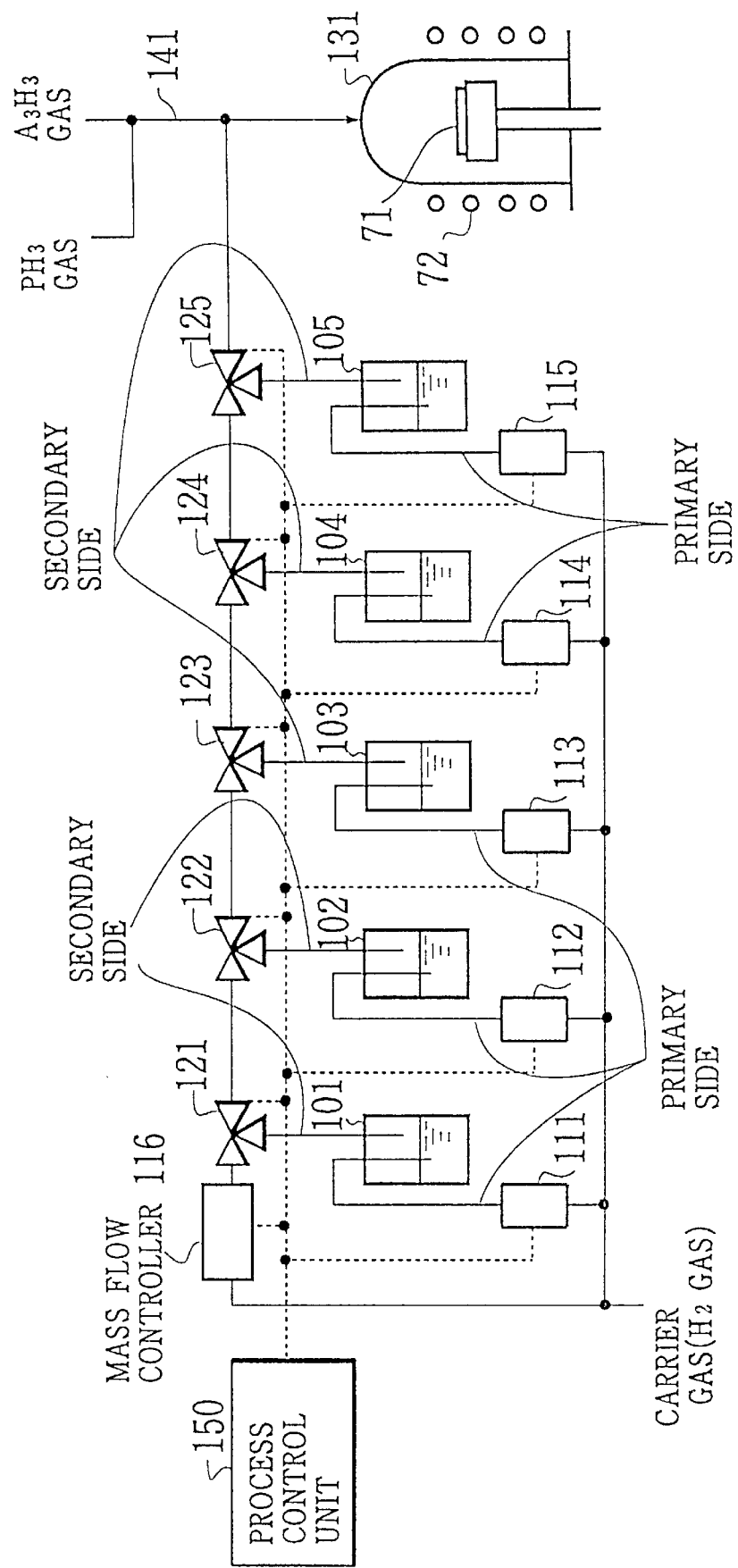
FIG. 1 is a general configuration drawing showing a conventional vapor deposition device for fabricating a compound semiconductor.
Figure 2:
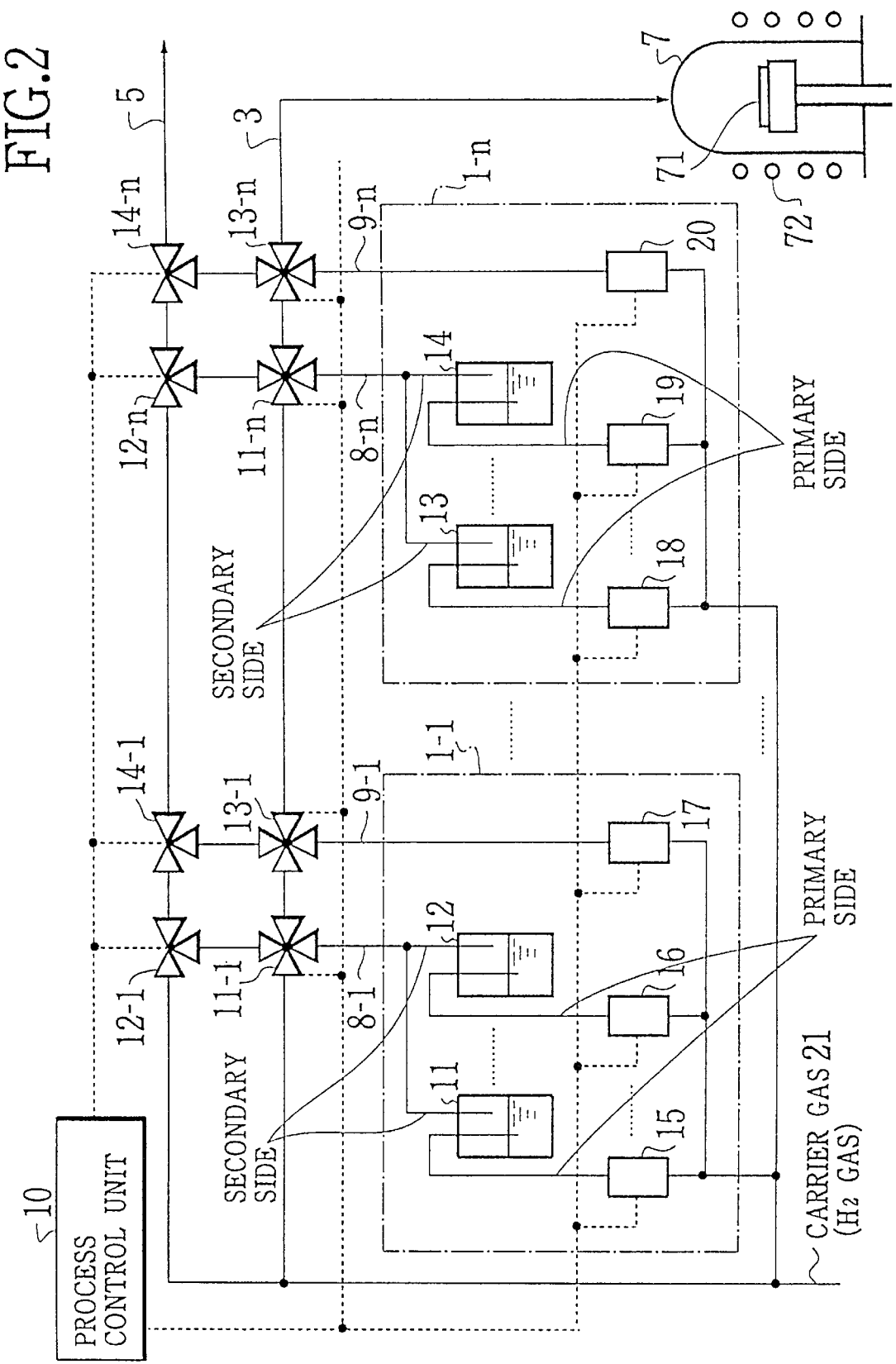
FIG. 2 is a general configuration drawing showing the out-line of a vapor deposition device for fabricating a compound semiconductor according to the present invention.

As a first special feature of the vapor deposition device for fabricating a compound semiconductor of the present invention, as shown in FIG.2, when different varieties of thin films are propagated by the metal organic chemical vapor deposition (MOCVD) method, one organometallic gas supply line 3 is provided and a plurality of types of organometallic gases are supplied to this one supply line from a plurality of organometallic gas supply systems 1-1 to 1-n.

Supply lines (or secondary sides) 8-1 to 8-n for the organometallic gas supply systems 1-1 to 1-n are connected to a first valve group 11-1 to 11-n. In addition, a vent line 5 is provided, connecting the supply lines 8-1 to 8-n for the organometallic gas supply systems 1-1 to 1-n to a second valve group 12-1 to 12-n.

In the first organometallic gas supply system 1-1, mass flow controllers 15, 16 control the supply of specified organometallic gases in bubbler vessels 11 and 12 to a organometallic gas supply line 3 and a vent line 5.

Similarly, in the n-th organometallic gas supply system 1-n, mass flow controllers 18, 19 control the supply of specified organometallic gases in bubbler vessels 13 and 14 to the organometallic gas supply line 3 and the vent line 5.

Additionally, when a certain layer of film is formed the organometallic gas is supplied at a specified flow rate and, in the case where the specified total flow is not provided within the reaction furnace 7 necessary amount of carrier gas is supplied by mass flow controllers 17 and 20 to compensate for the flow rate.

The operations of the mass flow controllers 17 and 20, the first to fourth valve groups 11-1 to 11-n, 12-1 to 12-n, 13-1 to 13-n, and 14-1 to 14-n, and the mass flow controllers 15, 16, 18, and 19 are controlled under a process control unit 10 such as a microcomputer system.

When a certain thin-film layer is formed, the specified organometallic gas supply system 1-i (where i=1 to n) is selected by opening and closing the first valve group 11-1 to 11-n of the organometallic gas supply line 3 and the gas is supplied to a reaction furnace 7 to propagate the film.

At the same time, an organometallic gas supply system 1-j (where j=1 to n), which is to be used next, is selected by opening and closing the second valve group 12-1 to 12-n, to allow flow into the vent line 5.

When changing to the next layer, the organometallic gas from the organometallic gas supply system 1-j, which is already flowing into the vent line 5, is supplied to the reaction furnace 7 through the organometallic gas supply line 3 by opening and closing the first valve group 11-1 to 11-n and the second valve group 12-1 to 12-n.

In addition, at this time, an organometallic gas supply system 1-k (where k=1 to n), which is to be used next, is allowed to flow into the vent line 5.

As a result, it is possible to immediately supply to the reaction furnace an organometallic gas to be used in the next film-forming operation, so that film-forming with good uniformity is made possible.

Also, as a second special feature of the vapor deposition device for fabricating a compound semiconductor of the present invention, a plurality of dedicated flow compensation lines 9-1 to 9-n is provided in parallel on the organometallic gas supply systems 1-1 to 1-n.

However, when the specified flow rate of the organometallic gas differs from a flow rate at the total film-forming time, the flow rate of the carrier gas $H_2$ for flow compensation must also be changed.

When gas is supplied from the particular organometallic gas supply system 1-i to the organometallic gas supply line 3, from a flow compensation line 9-n of another organometallic gas supply system 1-h (where h≠i), carrier gas is supplied at the flow rate required to synthesize the various types of organometallic gas in the organometallic gas supply system 1-h.

As a result, it is possible to normally have a uniform total gas flow in the reaction furnace 7, so that film-forming with good uniformity is possible, and an integrated circuit with good characteristics can also be created.

An explanation of the preferred embodiment of the present invention will now be given with reference to the drawings.

Figure 3:
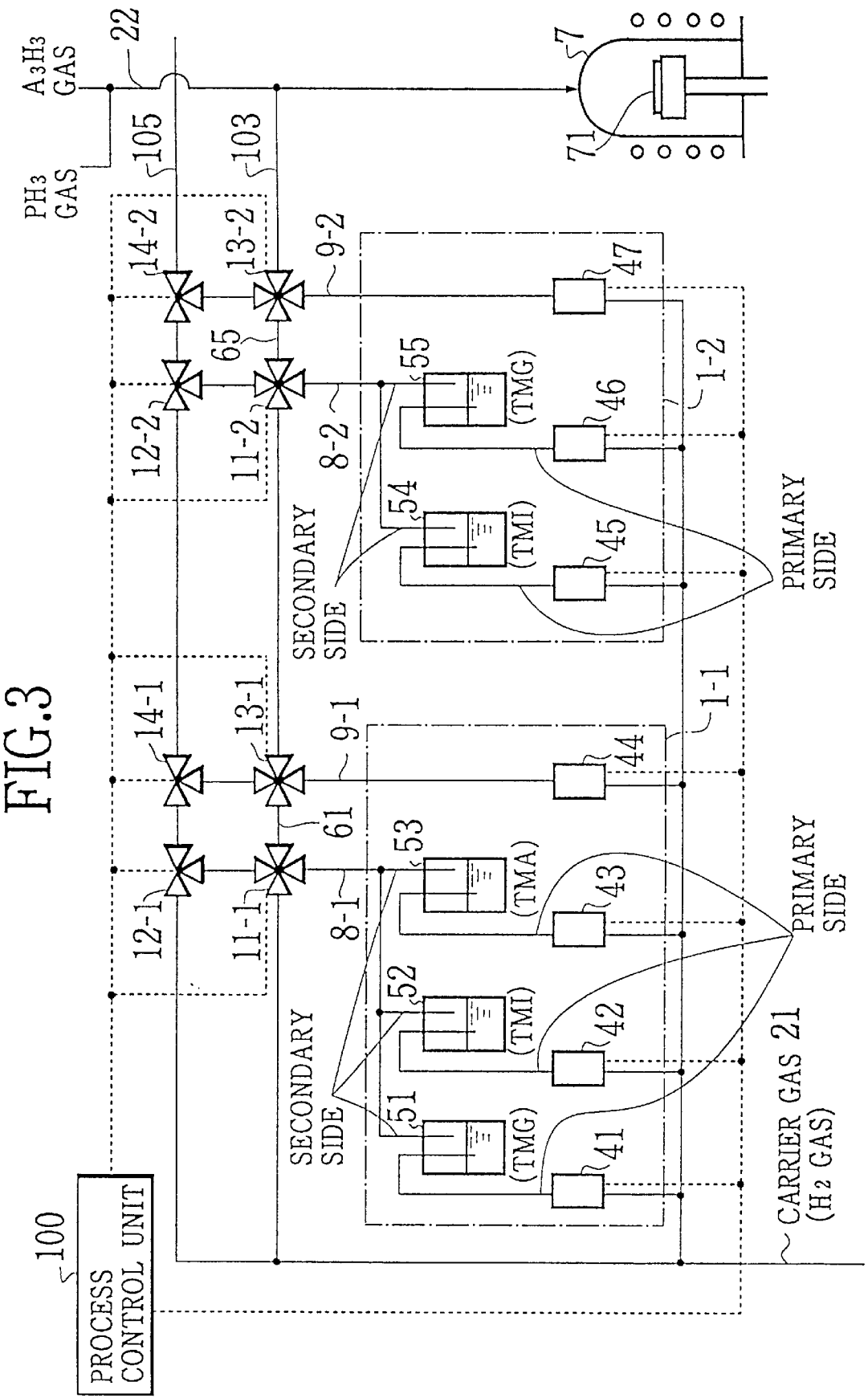
FIG. 3 is a general configuration drawing showing a vapor deposition device for fabricating a compound semiconductor as an preferred embodiment according to the present invention.

FIG.3 is a configuration drawing showing an embodiment of a vapor deposition device for fabricating a compound semiconductor of the present invention.

As shown in the drawing, this embodiment of a vapor deposition device for a compound semiconductor comprises first and second organometallic gas supply systems 1-1 and 1-2 for synthesizing and supplying a plurality of organometallic gases; a first group of valves 11-1 and 11-2 for selecting a specific system 1-i (where i=1, 2 in this embodiment) from the first and the second organometallic gas supply systems 1-1 and 1-2 by opening and closing the relevant valve group; an organometallic gas supply line 103 connected to the first group of valves 11-1 and 11-2 (actually, to the first group of valves 11-1 and 11-2 and to a third group of valves 13-1 and 13-2); a second group of valves 12-1 and 12-2 for selecting a system 1-j (where j=1, 2 in this embodiment), from the first and the second organometallic gas supply systems 1-1 and 1-2 by opening and closing the relevant valve group; a vent line 105 connected to the second group of valves 12-1 and 12-2 (actually, to the second group of valves 12-1 and 12-2 and to a fourth group of valves 14-1 and 14-2); a reaction furnace 7 for continuously propagating different types of thin films by means of organometallic gases supplied from the organometallic gas supply line 103; a carrier gas supply line 21 for supplying a carrier gas (hydrogen: $H_2$) from a carrier gas supply source (omitted from the drawings) ; and a supply line 22 for supplying $PH_3$ (phosphine) gas and $AsH_3$ (arsine) gas to the reaction furnace 7.

Further, the supply line 22 is connected to the organometallic gas supply line 103 as a centralized line supplying the reaction furnace 7.

The first and second organometallic gas supply systems 1-1 and 1-2 are controlled by a pair of mass flow controllers 44 and 47 so that carrier gas is supplied at the flow rate required to synthesize the various types of organometallic gases, and are provided with flow compensation lines 9-1 and 9-2 for supplying carrier gas.

The flow compensation lines 9-1 and 9-2 are connected to the organometallic gas supply line 103 and the vent line 105 respectively through the third group of valves 13-1 and 13-2 and the fourth group of valves 14-1 and 14-2.

The first organometallic gas supply system 1-1 is an organometallic gas supply system used for an InGaAlP film.

TMG (TriMethyl Gallium), TMI (TriMethyl Indium), and TMA (TriMethyl Aluminum) are stored in bubbler vessels 51, 52, and 53 respectively.

Carrier gas $H_2$ controlled at a specified flow rate is supplied to the primary side from mass flow controllers 41, 42, and 43 respectively.

The secondary sides of the bubbler vessels 51, 52, and 53 are linked to the supply line 8-1 connected to the first valve 11-1.

The carrier gas flow rate controlled by a mass flow controller 44 on the flow compensation line 9-1 is set at a total flow value (A+B+C) made up of the flows A, B, and C supplied from the mass flow controllers 41, 42, and 43.

The second organometallic gas supply system 1-1 is an organometallic gas supply system used for an InGaP film.

TMI (TriMethyl Indium) and TMG (TriMethyl Gallium) are stored in bubbler vessels 54 and 55 respectively.

Carrier gas $H_2$ controlled at a specified flow rate is supplied to the primary side from mass flow controllers 44 and 45 respectively.

The secondary sides of the bubbler vessels 54 and 55 are linked to the supply line 8-2 connected to the first valve 11-2. The carrier gas flow rate controlled by a mass flow controller 47 on the flow compensation line 9-2 is set at a total flow value (D+E) made up of the flows D and E supplied from the mass flow controllers 45 and 46.

The operations of the mass flow controllers 44 and 47, the first to fourth valve groups 11-1 to 11-n, 12-1 to 12-n, 13-1 to 13-n, and 14-1 to 14-n, and the mass flow controllers 41, 42, 43, 45, and 46 are controlled under a process control unit 100 such as a microcomputer system.

First, when an InGaP film is formed, the TMI (flow amount D) and TMG (flow amount E) which are already flowing in the vent line 105 are supplied to the reaction furnace 7 from the supply line 8-2 via the organometallic gas supply line 103 by way of the first valve 11-2, a line 65 and the third valve 13-2, by switching the first valve 11-2 and the second valve 12-2.

At the same time, the carrier gas $H_2$ (flow amount A+B+C) from the flow compensation line 9-1 of the first organometallic gas supply system 1-1 under the control of the mass flow controller 44 flows into the organometallic gas supply line 103 through the third valve 13-1. Also, at the same time, $PH_3$ gas passes through the supply line 22 and flows into the organometallic gas supply line 103, and an InGaP film is propagated by the vapor phase method on a semiconductor substrate 71 in the reaction furnace 7.

At this time, TMG (flow amount A), TMI (flow amount B), and TMA (flow amount C) from the first organometallic gas supply system 1-1 is caused to flow into the vent line 105 through the first valve 11-1 and the second valve 12-1 to form the next InGaAlP film.

Next, at the same time as the change in forming the InGaAlP film, the first organometallic gas for forming the InGaAlP film which is already flowing in the vent line 105, the carrier gas (flow amount D+E) from the flow compensation line 9-2 of the second organometallic gas supply system 1-2 under the control of the mass flow controller 47, and the $PH_3$ gas from the supply line 22, flow together into the organometallic gas supply line 103 and are supplied to the reaction furnace 7 so that an InGaAlP film is propagated by the vapor phase method on the semiconductor substrate 71.

The example was used in explaining this embodiment whereby the first and second organometallic gas supply systems 1-1 and 1-2 were used to form an InGaAlP film and an InGaP film.

However, the present invention is not limited to this example. The organometallic gas supply systems 1-1 to 1-n are provided to correspond to various types of propagated thin-films and are connected to the organometallic gas supply line 3 through the first valve group 11-1 to 11-n and the third valve group 13-1 to 13-n.

In addition, it is possible to create various types of compound semiconductors by vapor deposition by providing the vapor deposition device for fabricating a compound semiconductor connected to the vent line 105 through the second valve group 12-1 to 12-n and the fourth valve group 14-1 to 14-n.

As described above, the present invention is provided with a single supply line for synthesizing a plurality of types of organometallic gases from various organometallic gas supply systems.

This organometallic gas supply line is connected to the supply lines to these organometallic gas supply systems through a first group of valves. The supply lines to the organometallic gas supply systems are also connected to a vent line through a second group of valves.

When a certain layer of film is being formed, the specified organometallic gas supply system is selected by opening and closing the first group of valves on the organometallic gas supply line, and gas is supplied to the reaction furnace.

Simultaneously, the next organometallic gas supply system to be used is selected by opening and closing the second group of valves, and the gas is caused to flow into the vent line. When a change is made to form the next layer of film, the organometallic gas which is already flowing in the vent line 105 is supplied to the reaction furnace through the organometallic gas supply line by opening and closing the first and second groups of valves.

Therefore the organometallic gas for the next film-forming operation can be immediately supplied to the reaction furnace, making it possible to provide a vapor deposition device for fabricating a compound semiconductor which forms a film with good uniformity.

In addition, in the present invention a plurality of dedicated flow compensation lines is provided in parallel on the organometallic gas supply systems.

When gas is supplied from a certain organometallic gas supply system to the organometallic gas supply line, carrier gas is supplied from the flow compensation line of another organometallic gas supply system at the flow rate required to synthesize the various types of organometallic gas in the organometallic gas supply system.

It is therefore possible to normally have a uniform total gas flow in the reaction furnace, to provide film-forming with good uniformity.

It is therefore possible to provide a vapor deposition device for fabricating a compound semiconductor which can create an integrated circuit with good characteristics.

What is claimed is:

1. A method of fabricating a compound semiconductor having a plurality of layers, comprising the steps of:
    (a) directing organometallic gases supplied from a first organometallic gas supply system to the inside of a reaction furnace containing a substrate for fabricating a first layer of the compound semiconductor, while releasing organometallic gases supplied from a second organometallic gas supply system through a vent line;
    (b) directing the organometallic gases supplied from the second organometallic gas supply system to the inside of the reaction furnace by switching a first valve which is provided for selectively connecting the second organometallic gas supply system with either one of the vent line and the reaction furnace, while releasing the organometallic gases supplied from the first organometallic gas supply system through the vent line by switching a second valve which is provided for selectively connecting the first organometallic gas supply system with either one of the vent line and the reaction furnace;
    wherein a carrier gas is passed through a third valve at a fixed flow rate from a source of the carrier gas and selectively directed to either one of the vent line and the reaction furnace by switching said third valve in order to maintain the flow rate of the carrier gas from the source of the carrier gas and the pressure inside of the reaction furnace during fabrication of said plurality of layers.

2. A method according to claim 1, wherein the organometallic gases for fabricating a second layer of the compound semiconductor flow from the second organometallic gas supply system through the vent line at a constant flow rate.

3. A method according to claim 1, wherein the organometallic gases from the first organometallic gas supply system include trimethyl gallium, trimethyl indium a nd trimethyl aluminum.

4. A method according to claim 1, wherein the organometallic gases from the second organometallic gas supply system include trimethyl gallium and trimethyl indium.

5. A method according to claim 1, wherein one of the first or second organometallic gas supply systems is used to fabricate a InGaAlP film.

6. A method according to claim 1, wherein one of the first or second organometallic gas supply systems is used to fabricate a InGaP film.

7. A method according to claim 5, wherein one of the organometallic gas supply systems is used to fabricate a InGaP film.

8. A method of fabricating a compound semiconductor having a plurality of layers, comprising the steps of:
    (a) directing organometallic gases supplied from a first organomptallic gas supply system to the inside of a reaction furnace containing a substrate through an organometallic gas supply line for fabricating a first layer of the compound semiconductor, while releasing organometallic gases supplied from a second organometallic gas supply system though a vent line;
    (b) directing the organometallic gases supplied from the second organometallic gas supply system to the inside of the reaction furnace by switching a first valve which is provided for selectively connecting the second organometallic gas supply system with either one of the vent line and the organometallic gas supply line, while releasing the organometallic gases supplied from the first organometallic gas supply system through the vent line by switching a second valve which is provided for selectively connecting the first organometallic gas supply system with either one of the vent line and the reaction furnace,
    wherein first and second carrier gas supplying lines are connected to the vent line and the organometallic gas supply line through a third valve configuration, the first carrier gas supplying line supplying a carrier gas during fabrication of said first layer to the inside of the reaction furnace at the same flow ratio as the second organometallic gas supply system supplies the organometallic gases to the inside of the reaction furnace during fabrication of said second layer, the second carrier gas supplying line supplying the carrier gas during fabrication of said second layer to the inside of the reaction furnace at the same flow ratio as the first organometallic gas supply system supplies the organometallic gases to the inside of the reaction furnace during fabrication of said first layer.

* * * * *